United States Patent [19]

Takada et al.

[11] Patent Number: 5,362,711
[45] Date of Patent: Nov. 8, 1994

[54] METHOD FOR PRODUCING SINGLE CRYSTAL SUPERCONDUCTING $LNA_2CU_3O_{7-x}$ FILMS

[75] Inventors: Toshio Takada; Takahito Terashima, both of Kyoto; Yoshichika Bando, Ohtsu, all of Japan

[73] Assignees: Kanegafuchi Chemical Industry Co., Ltd.; Matsushita Electric Inductris Co., Ltd., both of Osaka; NEC Corporation, Tokyo; Nippon Mining Co., Ltd., Tokyo; Nippon Steel Corporation, Tokyo; TDK Corporation, Tokyo; Tosoh Corporation, Yamaguchi; Toyo Boseki Kabushiki Kaisha, Osaka; Seisan Kaihatsu Kagaku Kenkyusho, Kyoto; Ube Industries, Ltd., Yamaguchi, all of Japan

[21] Appl. No.: 53,318

[22] Filed: Apr. 27, 1993

Related U.S. Application Data

[60] Division of Ser. No. 818,655, Jan. 7, 1992, abandoned, which is a continuation of Ser. No. 247,261, Sep. 21, 1988, abandoned.

[30] Foreign Application Priority Data

| Sep. 21, 1987 | [JP] | Japan | 62-236792 |
| Sep. 21, 1987 | [JP] | Japan | 62-263793 |
| Dec. 11, 1987 | [JP] | Japan | 62-314670 |
| Dec. 15, 1987 | [JP] | Japan | 62-318074 |
| Feb. 15, 1988 | [JP] | Japan | 63-33630 |
| Mar. 10, 1988 | [JP] | Japan | 63-57207 |
| Mar. 28, 1988 | [JP] | Japan | 63-75486 |

[51] Int. Cl.$^5$ .......................... B05D 3/06; B05D 5/12
[52] U.S. Cl. .................. 505/476; 505/729; 505/730; 505/732; 505/473; 427/62; 427/576; 427/573; 427/126.3; 427/314; 427/419.2; 427/419.3
[58] Field of Search .............. 505/1, 729, 730, 732, 505/701, 702; 427/62, 63, 314, 126.3, 576, 419.2, 419.3; 156/610, 612

[56] References Cited

U.S. PATENT DOCUMENTS

| 4,824,826 | 4/1989 | Damento | 252/521 |
| 4,956,339 | 9/1990 | Yamazaki | 252/521 |
| 5,108,984 | 4/1992 | Shioya et al. | 505/1 |

OTHER PUBLICATIONS

Tarascon "Oxygen and rare-earth doping of the 90-K . . . " *Physical Rev.* B v. 36(1) Jul. 1, 1987 pp. 226–234.

Cook "Fracture toughness measurements at $YBa_2Cu_3O_x$" *Appl. Phys. Lett* v. 51(6) Aug. 10, 1987 pp. 454–456.

Ono "Preparation of Single Crystals of $Ba_3YCu_3O_{6.5+x}$" *Jap. Jnl. Appl. Physics* v. 26(5) May 1987 pp. L825–L827.

Hidaka "Anisotropy of the Upper Critical Magnetic field . . . " *Jap. Jnl. Appl. Physc.* v. 26(5) May 1987 pp. L726–L728.

Schneemeyer "Superconductivity in $YBa_2Cu_3O_7$ single crystals" *Nature* v. 328 Aug. 13, 1987 pp. 601–602.

Hayashi "Preparation and Characterization of Ba–Y–Cu–O . . . " *Jap. Jnl. Appl. Phys.* v. 26(7) Jul. 1987 pp. L1240–L1243.

Adachi et al., "Superconductivity in $(La_{0.9}Sr_{0.1})_2CuO_4$ Single Crystal files" *Physical Review* B, vol. 35, No. 16, Jun. 1, 1987, pp. 8824–8825.

(List continued on next page.)

*Primary Examiner*—Roy V. King
*Attorney, Agent, or Firm*—Wenderoth, Lind & Ponack

[57] ABSTRACT

A process for forming a single crystal superconducting $LnA_2Cu_3O_{7-x}$ film, wherein Ln is at least one rare earth element and A is at least one alkaline earth element, is disclosed, which comprises simultaneously evaporating Ln, A and Cu in an atomic ratio of about 1:2:3 from discrete evaporation sources of Ln, A and Cu onto a heated substrate in a vacuum vessel while blowing an oxygen gas onto the substrate to form an oxygen-containing atmosphere, thereby forming the single crystal superconducting film on the substrate.

14 Claims, 14 Drawing Sheets

OTHER PUBLICATIONS

Suzuki et al., "Carrier Density of Superconducting $(La_{1-x}Sr_x)_2CuO_4$ Single Crystal Thin Films" Jap. J. Appl. Phys. vol. 26 Supplement 26-3 pp. 1103-1104, Aug. 20-26, 1987.

Laibowitz et al., "Thin Superconducting Oxide Films", Physical Review B vol. 35, No. 16 Jun. 1, 1987 pp. 8821-8823.

Tonouchi et al., "Sputter-formation and Patterning process of high . . . " Extended Abstracts of 1987 Inter. Supercond. Electronics Conf. Aug. 28-29, 1987 p. 394.

Sato et al., "High-Tc superconductivities of $A_2Ba_4Cu_6O_{11+y}$" Jpn. J. Appl. Phys. part 2 vol. 26 No. 5, pp. L856-L857 May 1987.

Chaudhari et al, "Critical-current measurements in epitaxial films of $YBa_2Cu_3O_{7-x}$ compound", Physical Review Letters, 58(25) Jun. 1987 pp. 2684-2686.

Applied Physics Letters, vol. 51, No. 11, 14 Sep. 1987, pp. 852-854; B. Oh et al: "Critical current densities and transport in superconducting YBa2Cu3O7-d films made by electron beam coevaporation".

Japanese Journal of Applied Physics. letters vol. 26, No. 5, May 1987, pp. 876-878; M. Onoda et al: "Cristal structures of YBa2Cu3Ox and LnBa2Cu3Ox (Ln=Ho and Dy)".

Japanese Journal of Applied Physics. letters vo. 26, No. 7, Jul. 1987, pp. 1248-1250; Y. Enomoto et al: "Largely anisotropic superconducting critical current in epitaxially grown Ba2YCu3O7-y thin film".

Japanese Journal of Applied Physics. letters vol. 27, No. 1, Jan. 1988, pp. 91-93; T. Terashima et al: "Single-cristal YBa2Cu3O7-x thin films by activated reactivated evaporation".

Applied Physics Letters. vol. 51, No. 26, 28 Dec. 1987, pp. 2263-2265; H. Adachi et al: "Low-temperature process for the preparation of high Tc superconducting thin films".

Japanese Journal of Applied Physics. letters vol. 26, No. 11, Nov. 1987, pp. 1921-1924; M. Suzuki et al: "Anisotropic properties of superconducting (La1-xSrx)2CuO4 single-cristal thin films".

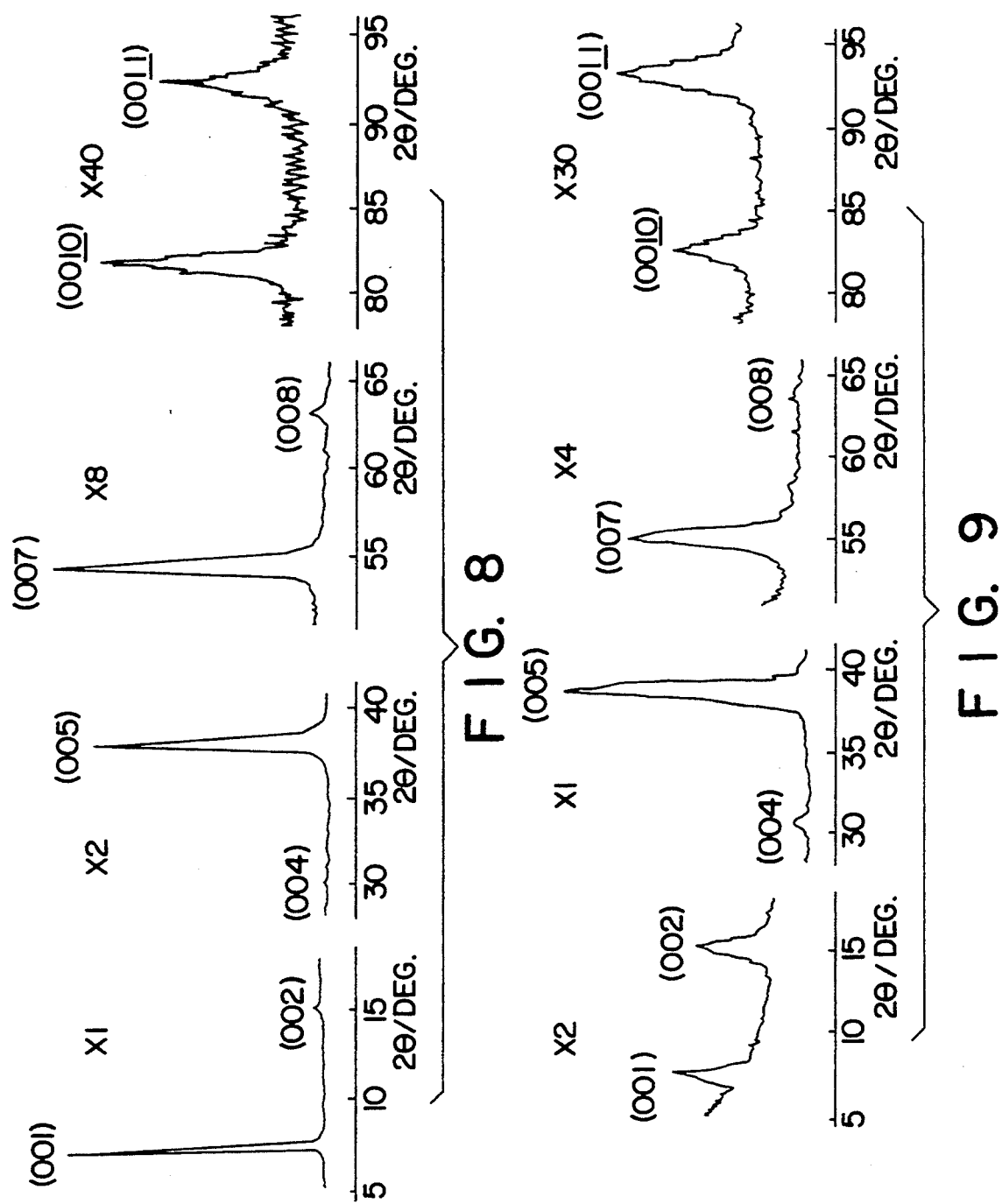

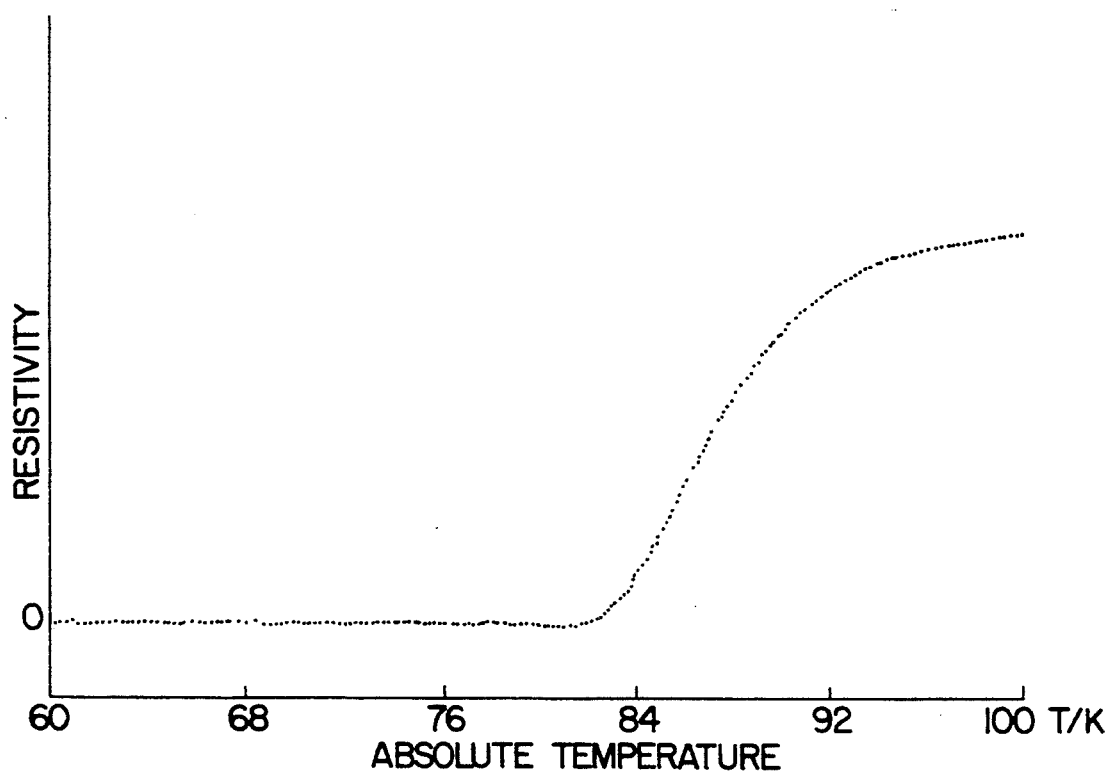
F I G. 10
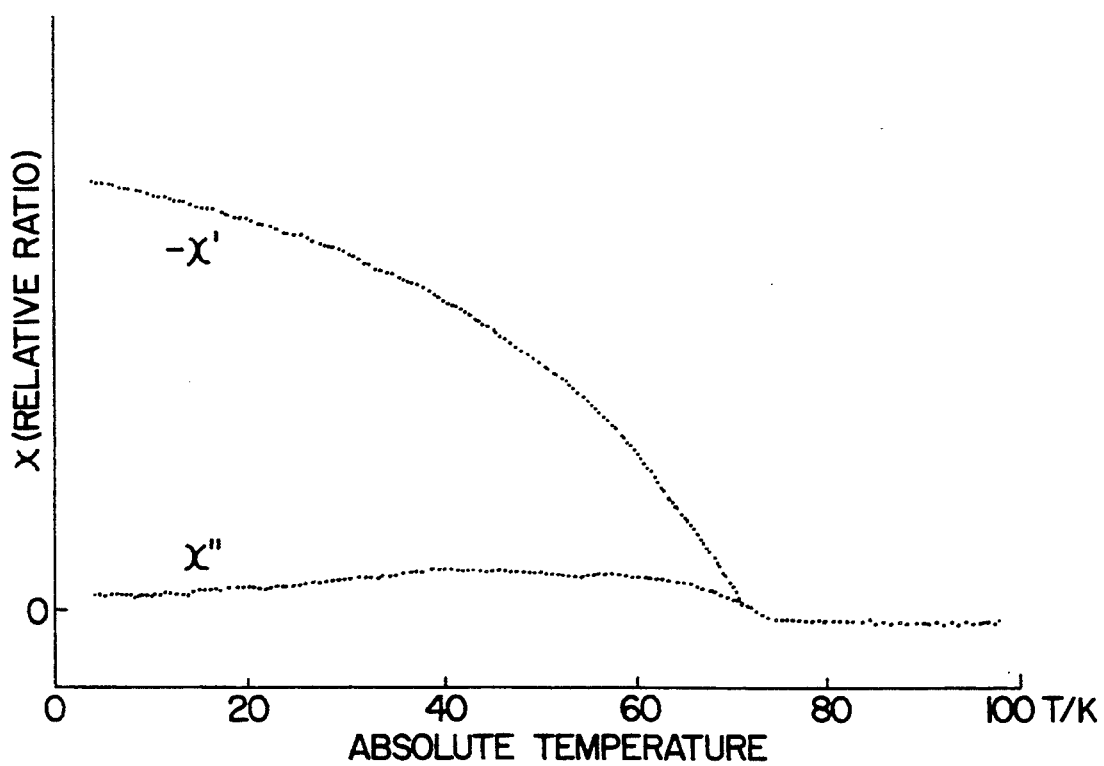
F I G. 11

[110] ↳ [Ī10]

[110] ↳ [001]

[30Ī],[110] ↳ [30Ī],[Ī10]

[30Ī][110] ↳ [010],[001]

[30Ī],[110] ↳ [30Ī][Ī10]

[30Ī][110] ↳ [010][001]

[301]↳[30Ī]

[301]↳[010]

[110]↳[Ī10]

[110]↳[001]

[301]↳[30Ī]

[30Ī]↳[010]

[301] ← [30$\bar{1}$]

[301] ← [010]

[110] ↑ → [1$\bar{1}$0]

[110] ↑ → [001]

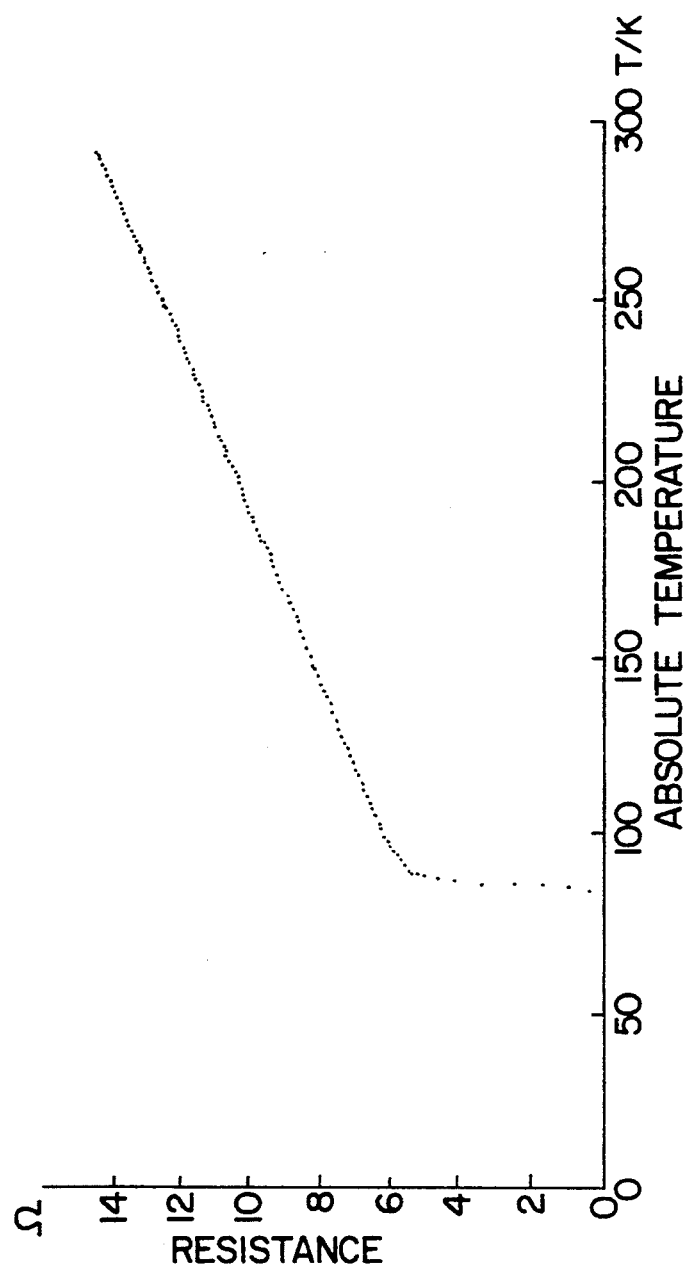

METHOD FOR PRODUCING SINGLE CRYSTAL SUPERCONDUCTING $LnA_2Cu_3O_{7-x}$ FILMS

This application is a divisional of now abandoned application, Ser. No. 07/818,655, filed Jan. 7, 1992, which is a continuation of Ser. No. 07/247,261 filed Sep. 21, 1988, also abandoned.

BACKGROUND OF THE INVENTION

1. Field of the Invention

The present invention relates to a thin film of a single crystal of an oxide of the formula:

$$LnA_2Cu_3O_{7-x} \qquad (I)$$

wherein Ln is at least one rare earth element selected from the group consisting of Y, Nd, Sm, Eu, Gd, Dy, Ho, Er, Tm and Yb and A is at least one alkaline earth metal selected from the group consisting of Ba, Sr and Ca which has a three-layered perovskite structure and a process for producing the same.

2. Description of the Related Art

A thin film of $LnA_2Cu_3O_{7-x}$ having a three-layered perovskite structure exhibits superconductivity around 90K will find various new applications such as wiring of LSI, SQUID and Josephson tunnel type elements.

For such applications, the $LnA_2Cu_3O_{7-x}$ thin film should have a critical temperature Tc at 85K or higher, a critical current density Jc of $10^5$ A/cm$^2$ or higher when a film is not thicker than 5,000 Å and should be formed at a comparatively lower temperature.

Since a wiring material of LSI is required to have a large current density, the single crystal thin film should have a specific plane such as a (001), (110) or (103) plane parallel with a film plane so that electric current can flow in said specific plane.

In the Josephson tunnel type element using the superconducting $LnA_2Cu_3O_{7-x}$, an insulating ultrathin layer between the superconductors for tunnel junction is required to have a thickness of not larger than 30 Å. To form such junction, it is essential to produce a superconductive film having good surface smoothness and an ultrathin insulating layer on it. A thickness of the insulating ultrathin layer for forming a junction is limited by a coherence length of a superconductor. The coherence length in a direction perpendicular to the (001) plane is about 4 to 7 Å, and that in a direction parallel to said plane is about 15 to 30 Å.

Therefore, the thickness of the insulating ultra-thin layer to be used for junction varies with a kind of the superconductor and its crystal direction to be connected. When a direction perpendicular to the (001) plane of the superconductor coincides with the direction perpendicular to the surface of the insulating layer, the thickness of the latter should be 10 Å or less. On the contrary, when a direction parallel with the (001) plane of the superconductor coincides with the direction perpendicular to the surface of the insulating layer, the thickness of the latter can be as thick as several ten Å, which makes the formation of tunnel junction easy. Accordingly, a (110) oriented single crystal film may be more available for the tunnel type junction than a (001) oriented film.

In the practical applications, it is required to provide a single crystal film having the (110) plane in a direction parallel with the film plane. In addition, since a single crystal film with an other orientation can achieve a large current density, it is suitable for forming a wire to be used in a superconductive magnet.

In the most cases, the single crystal film of $LnA_2Cu_3O_{7-x}$ has been prepared by a sputtering method. The sputtering method comprises irradiating a plasma of oxygen (O$_2$) and/or argon gas against a target consisting of a Ln—A—Cu base oxide in a vacuum vessel and depositing sputtered metals and the like on a substrate such as a SrTiO single crystal piece placed in said vessel to form a $LnA_2Cu_3O_{7-x}$ thin film. To covert the deposited $LnA_2Cu_3O_{7-x}$ thin film to a film exhibiting high quality superconductivity with Tc of 77K or higher, it is necessary to thermally treat the film at a temperature of 800° C. or higher.

By the scientists in the Watson Research Laboratory of IBM or the Stanford University, a superconductive oxide thin film is produced by electron beam deposition. But, the as-deposited film is amorphous and does not have superconductive characteristics as such. Therefore, the deposited film is post-heated at a high temperature of 800° to 1,000° C. to crystallize the amorphous film to a perovskite crystal having a three-layered structure, whereby the produced film exhibits superconducting transition at 77K or higher.

By the conventional sputtering method or the conventional electron beam deposition, no film which is substantially a single crystal having the (001), (110) or (103) plane parallel with the film surface has been provided, and either method has its own drawbacks.

For example, in the sputtering method, it is difficult to prepare the target with a composition optimum for the formation of the superconducting film. Since a desired material is deposited solely by attacking the target with ions, not only characteristics of the film are delicately changed according to conditions of a plasma atmosphere and to quality of the target, but also the substrate or the deposited film is easily modified by ions. Therefore, this method has poor reproducibility.

Another problem resides in that the epitaxially grown $LnA_2Cu_3O_{7-x}$ oxide film should be thermally treated at a temperature of 800° C. or higher to increase the critical temperature to 77K or higher, preferably 85K or higher. By the thermal treatment, the surface of the thin film is roughened. Further, due to thermal treatment at high temperature, the substrate material and $LnA_2Cu_3O_{7-x}$ react with each other so that the thin layer having a thickness of 500 Å or less cannot be made superconductive.

A superconductive thin film which is produced by sputtering and subsequent thermal treatment at the lowest temperature is a 2,000 to 3,000 Å thick (001) oriented crystal film of $YBa_2Cu_3O_{7-x}$ which is formed on a sapphire substrate heated at a temperature of 550° to 650° C. It is reported that this film had zero electric resistance at 80K after thermally treated at a temperature of 550° to 650° C.

However, the critical temperature of 80K is still unsatisfactory, and the produced film seems to be heterogeneous from the results of X-ray analysis and change of electrical resistance against temperature.

In the conventional electron beam deposition, the deposited film should be thermally treated at a high temperature. Therefore, a kind of the substrate to be used is limited. When the substrate is inadequate, it reacts with the deposited material so that a part or whole of the deposited material is changed to a material which is different from the superconductor.

Further, a surface of the deposited film is less smooth. Because of the reaction between the substrate and the deposited material, it is difficult to obtain the superconducting film with a thickness of 5,000 Å or less.

SUMMARY OF THE INVENTION

One object of the present invention is to provide a thin film of a $LnA_2Cu_3O_{7-x}$ single crystal having a layered perovskite structure.

Another object of the present invention is to provide a process for producing a thin film of a $LnA_2Cu_3O_{7-x}$ single crystal having the perovskite structure directly on a deposition substrate.

According to the first aspect of the present invention, there is provided a thin film consisting of a single crystal of an oxide of the formula:

$$LnA_2Cu_3O_{7-x} \qquad (I)$$

wherein Ln is at least one rare earth element selected from the group consisting of Y, Nd, Sm, Eu, Gd, Dy, Ho, Er, Tm and Yb and A is at least one alkaline earth metal selected from the group consisting of Ba, Sr and Ca which has a three-layered perovskite structure in which
(1) a (001) plane,
(2) a (110) plane or
(3) a (103) plane
of the crystal is parallel with the film surface.

According to the second aspect of the present invention, there is provided a process for producing the above described thin film of the $LnA_2Cu_3O_{7-x}$ single crystal, which comprises simultaneously evaporating Ln, A and Cu in an atomic ratio of about 1:2:3 from discrete evaporation sources of Ln, A and Cu to deposit them on a substrate in a vacuum deposition vessel while supplying an oxygen gas from a distance close to the substrate to form an oxygen-containing atmosphere having a relatively high pressure at the substrate.

According to the third aspect of the present invention, there is provided a process for producing the above described thin film of the $LnA_2Cu_3O_{7-x}$ single crystal, which comprises generating plasma and simultaneously evaporating Ln, A and Cu in an atomic ratio of about 1:2:3 from discrete evaporation sources of Ln, A and Cu to deposit them on a substrate in a vacuum deposition vessel while supplying an oxygen gas from a distance close to the substrate to form an oxygen-containing atmosphere having a relatively high pressure at the substrate.

BRIEF DESCRIPTION OF THE DRAWINGS

FIGS. 6, 7, 8 and 9 are X-ray diffraction patterns of the thin films of $YBa_2Cu_3O_{7-x}$ single crystal formed in Example 7, the thin film of $DyBa_2Cu_3O_{7-x}$ single crystal formed in Example 8, the thin film of $ErBa_2Cu_3O_{7-x}$ single crystal formed in Example 8, and the thin film of $YBa_2Cu_3O_{7-x}$ formed in Example 9, respectively, FIGS. 10 and 11 are graphs showing the relationship between the resistivity and absolute temperature and the relationship between the complex susceptibility and the absolute temperature, respectively for the thin film of $YBa_2Cu_3O_{7-x}$ single crystal formed in Example 9, FIG. 21 is a graph showing the relationship between the resistivity and absolute temperature of the thin film formed in Example 12.

DETAILED DESCRIPTION OF THE INVENTION

Figure 1:
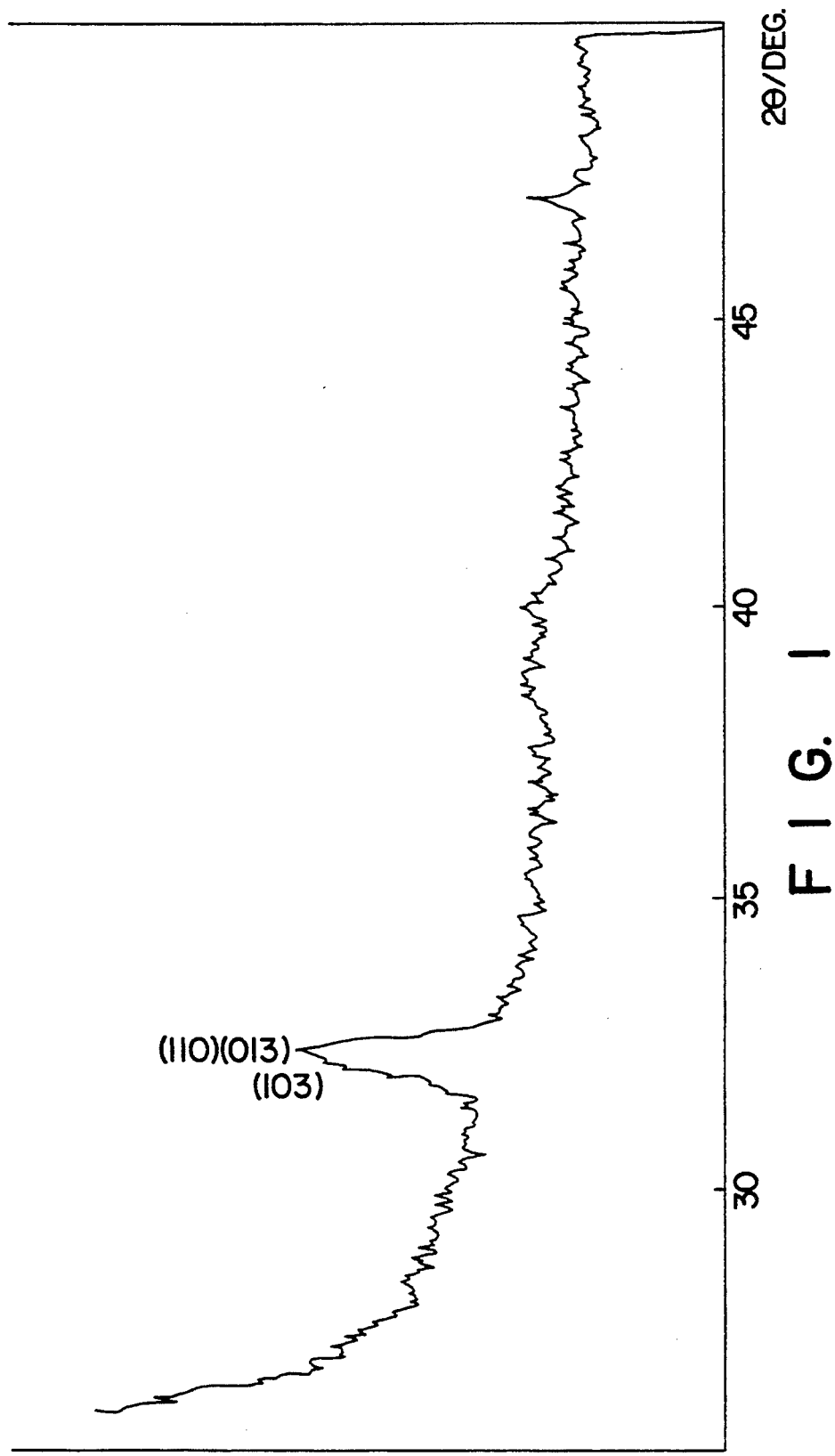
FIGS. 1 and 2 are X-ray diffraction patterns of the thin films of $YBa_2Cu_3O_{7-x}$ single crystal produced in Examples 1 and 2, respectively.

The microstructure, namely a poly crystal or a single crystal in the formed thin film of $LnA_2Cu_3O_{7-x}$ depends on a kind of the substrate.

That is, to produce the thin film of the $LnA_2Cu_3O_{7-x}$ single crystal with the orientation of the above (1) or (2), a single crystal of $SrTiO_3$, MgO, CoO, NiO and the like having the (001) plane or the (110) plane in its surface is used as a substrate, respectively.

The processes for producing the thin film of the $LnA_2Cu_3O_{7-x}$ single crystal can be applied to the production of a polycrystal of $LnA_2Cu_3O_{7-x}$. In this case, the kind of the substrate is not limited.

As described above, to produce the single crystal of $LnA_2Cu_3O_{7-x}$ having the specific crystal plane parallel with the substrate surface, the substrate should have said specific crystal plane on its surface.

The above requirements for the substrate are necessary conditions to make the specific crystal plane parallel with the substrate surface, but not sufficient conditions.

Suitable conditions for producing the thin film of the $LnA_2Cu_3O_{7-x}$ single crystal of the orientation (1) and those for producing the thin film of the $LnA_2Cu_3O_{7-x}$ single crystal of the orientation (2) are different as follows:

In the former case, the raw material metals are evaporated and deposited on the substrate heated at 500° C. or higher, while in the latter case, the raw material metals are evaporated and deposited on the substrate heated at a temperature not lower than 500° C. and lower than 550° C. to form the single crystal of $LnA_2Cu_3O_{7-x}$ having the orientation (2) and, after raising the substrate temperature to 550° C. or higher, the metals are further deposited on the already formed single crystal.

Namely, the $LnA_2Cu_3O_{7-x}$ single crystal having the orientation (1) can be produced under a relatively wide temperature range of 500° C. or higher, preferably 520° C. or higher but not so high as to adversely affect the substrate and the growing film. Thereby, the thin film having very good crystal structure is formed. On the contrary, when the thin film of the $LnA_2Cu_3O_{7-x}$ single crystal having the orientation (2) is produced, as described above, the substrate is heated at a temperature not lower than 500° C. and lower than 550° C., preferably around 530° C. in the first evaporation step so as to render the new substrate of $LnA_2Cu_3O_{7-x}$ thin film suitable for the formation of the desired material having the orientation (2) and, in the second step, the temperature at the new substrate is raised to 550° C. or higher, preferably 600° C. or higher. Under other conditions, no thin film having good superconductive characteristics is formed.

In other words, although the thin films formed in the first and second steps consist of the desired material, the thin film produced in the first step is used as a base film in the second step and only the thin film formed in the second step has good superconductive characteristics. As understood from below described working examples, the first and second steps are not necessarily carried out continuously.

In the present invention, the kind of the crystal plane is selected and the substrate temperatures are determined according to the orientation of the $LnA_2Cu_3O_{7-x}$ single crystal to be formed on the substrate. The thin film of the $LnA_2Cu_3O_{7-x}$ single crystal having the orientation (3) can be formed on the substrate at a higher temperature although the same crystal plane as in the case of the orientation (2) is used as the substrate. That is, to form the thin film of the $LnA_2Cu_3O_{7-x}$ single crystal having the orientation (3), the thin film is deposited on the substrate heated at 550° C. or higher, preferably 600° C. or higher.

The process of the present invention will be explained further in detail.

The vacuum deposition vessel is firstly evacuated to high vacuum of, for example, about $10^{-6}$ Torr. and then a small amount of the oxygen gas is continuously supplied towards the substrate from a distance close to the substrate to increase the pressure of oxygen at the substrate to $10^{-2}$ to $10^{-1}$ Torr. while an interior gas in the vessel is continuously exhausted from a suitable part of the vessel to keep the background at $10^{-5}$ to $10^{-3}$ Torr. in the vessel except near the substrate. The reason why the upper limit of the background pressure is selected to be $10^{-3}$ Torr. is that Ln, A and Cu in the evaporation sources are constantly evaporated without deterioration of evaporation rates. The lower limit of $10^{-5}$ Torr. is the minimum gas pressure for generating the plasma. If the plasma is not utilized, this lower limit is not technically important.

The reason why the oxygen gas pressure is increased only near the substrate in this embodiment is that Cu is not oxidized to $Cu^{2+}$ if the oxygen gas pressure is lower than $10^{-3}$ Torr.

The plasma can be generated by placing a high frequency coil between the evaporation sources and the substrate and oscillating it between the coil and the vessel wall at high frequency. While the plasma generation is preferred since reaction activities of the evaporated metals are increased, it may have some drawbacks such that the plasma attacks the desired material which is being formed if the plasma energy is too high. Therefore, an electric power for generating the plasma is preferably in a range from 50 to 500 W, preferably around 100 W.

Ln and A are evaporated by the electron beam and Cu is evaporated by electric resistance heating.

During evaporation of the metals by the above described evaporation means, the atomic ratio of Ln, A and Cu is adjusted to about 1:2:3 by adjusting the electric power according to results of preliminary experiments. Namely, in the preliminary experiments, how much metal Ln, A or Cu is evaporated and how much oxide $Ln_2O_3$, AO or CuO is formed by the specific electric power applied to each evaporation source per unit time are measured by a film thickness measuring device installed in the vacuum evaporation vessel near the substrate for each metal. Thereby, a relationship between an evaporation rate of each metal and the applied electric power is established and then the electric power to be applied to each evaporation source during formation of the thin film of the $LnA_2Cu_3O_{7-x}$ single crystal is determined.

As is clear from the comparison with the conventional sputtering method, the process of the present invention can produce reproducibly the desired material since it can be carried out while preventing contamination with impurities under easily controlled operating conditions.

The present invention has been completed based on the studies by the present inventors on the preparation and structures of thin films of oxide single crystals and their artificial superlattice thin films. According to the present invention, the oxide thin film is formed by the reactive evaporation. This is because this method has been found to be most suitable for producing the desired material which is required to have a good crystalline quality.

The reactive evaporation for preparing the oxide is a process comprising introducing the oxygen gas in the vacuum vessel, supplying metal atoms by evaporation on the substrate and forming the oxide while reacting the metal atoms with oxygen on the substrate.

The reasons why the reactive evaporation is suitable for the formation of oxide thin film are that (a) an amount of oxygen in the oxide can be controlled and (b) a single crystal with good quality in crystallinity is formed.

As to the reason (a), factors which determine the amount of oxygen in the oxide include an oxygen pressure, a substrate temperature, deposition rates of the metals and a kind of the substrate material. Since each of these factors can be changed independently from others, the amount of oxygen in the oxide can be freely adjusted. As to the reason (b), it has been found that when the single crystal is used as the substrate, a single crystal with excellent quality can be formed on the substrate. For example, when NiO is deposited on a sapphire C plane kept at 200° C. under oxygen pressure of $4 \times 10^{-4}$ Torr. at a deposition rate of 1 Å/S, NiO single crystal is synthesized with a (111) plane being parallel with the substrate surface. A half value width in a rocking curve according to X-ray scattering on this single crystal is 0.5°. When the oxygen plasma is generated by RF excitation during the above synthesis, the half value width decreases to 0.06°. This means increase of crystallinity.

In the artificial super lattice thin film in which layers of NiO and CoO are alternately accumulated, as a thickness of each layer is decreased, the rocking curve becomes sharp and is substantially the same as that of sapphire.

As understood from the above explanation, the reactive evaporation has suitable characteristics for synthesizing a single crystal with good quality. The reason for this is assumed as follows:

Growth of a crystal with forming a smooth surface is so called a single crystal growth. For such growth, following conditions should be met:

(1) The crystal is grown under conditions which are close to thermodynamical equilibrium.

(2) L/RT is larger than 2 where L is a latent heat for crystallization.

The condition (1) is achieved by (i) a small rate of crystal growth and (ii) preferential adsorption of the atoms onto high energy sites in the surface such as vacancies, kinks and steps. The condition (2) is easily satisfied by low temperature during crystal growth.

In the reactive evaporation, the condition (1) is achieved by following conditions:

Since oxygen molecules are adsorbed only by metal atoms, they are always adsorbed by and desorbed from the crystal surface to establish equilibrium. On the contrary, generally once adsorbed metal atoms are not desorbed. However, the metal atoms having higher energy acquired in the evaporation source can sufficiently move over the crystal surface so that they are adsorbed by the high energy sites on the crystal surface. If the energy distribution of the metal atoms which arrive the surface is narrow and the number of such metal atoms is decreased to such extent that each atom does not come into collision with other metal atoms on the surface, the condition (1) is achieved. To prevent the change of energy of the impinging metal atoms, the molecular beam is desirable if possible. Therefore, the pressure (oxygen pressure) is decreased to an order of $10^{-4}$ Torr so as to increase their mean free path. In case of a metal having a low evaporation temperature such as Zn, it should be excited by RF to improve the quality of the ZnO single crystal.

As described above, the reactive evaporation has been found to be one of the best methods for controlling the crystal growth conditions of the oxide, and the present invention has been completed.

PREFERRED EMBODIMENTS OF THE INVENTION

The present invention will be illustrated by following Examples.

EXAMPLE 1

A vacuum vessel having a diameter of 750 mm and a height of 1,000 mm was evacuated to $10^{-6}$ Torr. by an oil diffusion pump.

As a substrate, a piece of sapphire (single crystal $\alpha$-$Al_2O_3$) was used with a $(0\bar{1}12)$ plane forming a substrate surface (10 mm×10 mm) After placing the sapphire substrate in the vacuum vessel, it was heated to 650° C. and kept at this temperature with a tungsten heater.

From two nozzles for supplying the oxygen gas provided near both ends of the substrate, the oxygen gas was directly blown onto the substrate, whereby the gas pressure was increased to $10^{-2}$ to $10^{-1}$ Torr. only near the substrate, while the pressure near the evaporation sources which were placed apart from the substrate was increased to about $10^{-4}$ Torr.

Metals Y, Ba and Cu were evaporated from independent evaporation sources at such evaporation rates that the atomic ratio of Y:Ba:Cu was 1:2:3 on the substrate. For example, Y, Ba and Cu were evaporated at rates of 1 Å/sec., 2.3 Å/sec. and 1.7 Å/sec., respectively.

Between the substrate and the evaporation sources, a high-frequency (13.56 MHz) coil was placed, and high frequency was applied at 100 W so as to generate oxygen plasma, which activated the evaporated metals and accelerated the reactions on the substrate.

Under the above conditions, the metal oxides were deposited on the substrate to form a thin film having a thickness of 1,000 Å.

An X-ray diffraction pattern of the formed thin film is shown in FIG. 1.

Peaks for (013), (103) and (110) which are specific to the $YBa_2Cu_3O_{7-x}$ structure are clearly observed and the formation of a crystalline film is confirmed.

In the above procedures, Y and Ba were evaporated by electron beam, and Cu was evaporated by resistance heating. The evaporation conditions were as follows:

Y:

A metal ingot (purity: 99.9%) (50 g) was used and placed in a crucible cooled with water. The metal was evaporated by the application of an electron beam at an acceleration voltage of 5 KV and a filament current of 400 mA.

Ba:

A metal ingot (purity: 99.9%) (50 g) was used and evaporated by the application of the electron beam at an acceleration voltage of 5 KV and a filament current of 100 mA.

Cu:

In an alumina crucible around which a tungsten filament was wound, metal Cu particles (particle size of 2 to 3 mm, purity of 99.9999%) (10 g) were charged and heated by the application of electric current through the filament at 10 V, 30 A.

EXAMPLE 2

A vacuum vessel having a diameter of 750 mm and a height of 1,000 mm was evacuated to $10^{-6}$ Torr. by an oil diffusion pump.

A (001) plane of $SrTiO_3$ single crystal was used as a substrate (10 mm×10 mm) After placing the substrate in the vacuum vessel, it was heated to 650° C. and kept at this temperature with a tungsten heater.

From two nozzles for supplying the oxygen gas provided near both ends of the substrate, the oxygen gas was directly blown onto the substrate, whereby the gas pressure was increased to $10^{-2}$ to $10^{-1}$ Torr. only near the substrate, while the pressure near the evaporation sources which were placed apart from the substrate was increased to about $10^{-4}$ Torr.

Metals Y, Ba and Cu were evaporated from separate evaporation sources at such evaporation rates that the atomic ratio of Y:Ba:Cu was 1:2:3 on the substrate. For example, Y, Ba and Cu were evaporated at rates of 1 Å, 2.3 Å and 1.7 Å, respectively.

Between the substrate and the evaporation sources, a high-frequency coil was placed, and high frequency was applied at 100 W so as to generate oxygen plasma, which activated the evaporated metals and accelerated the reactions on the substrate.

Under the above conditions, the metal oxides were deposited on the substrate to form a 1,000 Å thick film.

Figure 2:
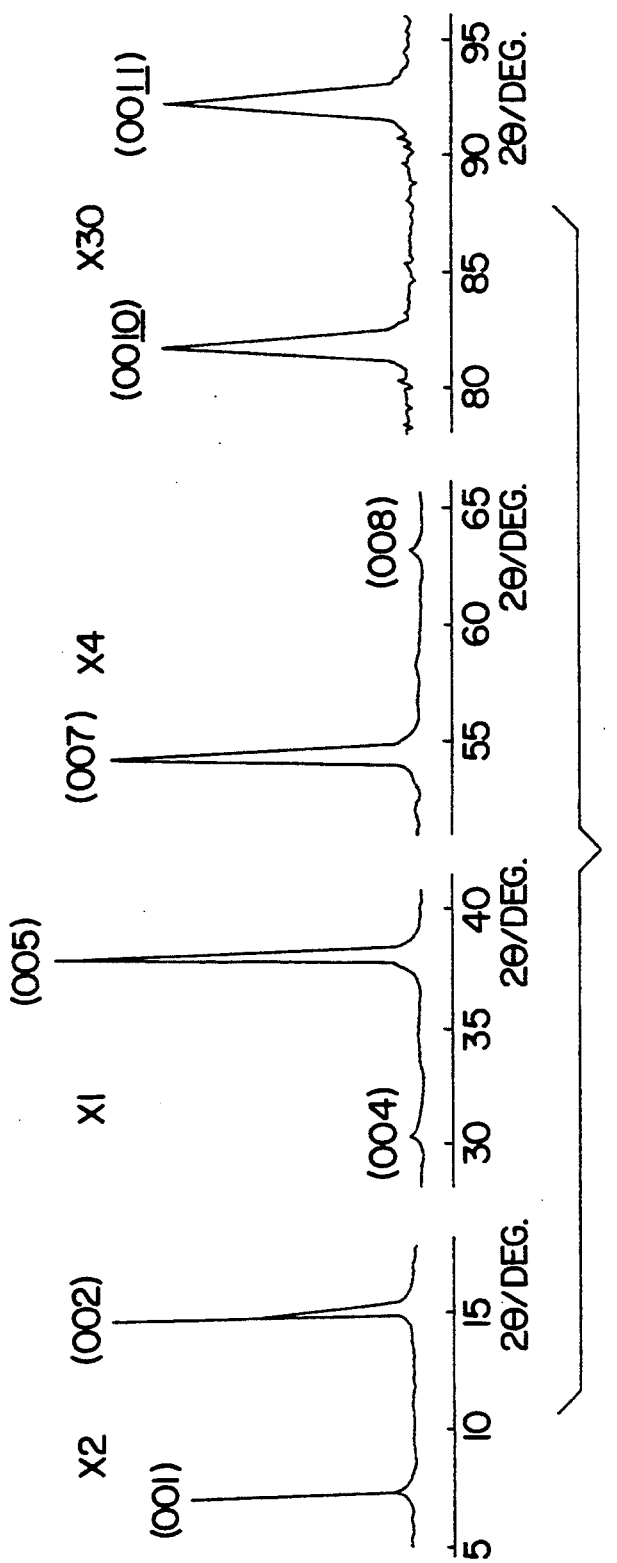

An X-ray diffraction pattern of the formed thin film is shown in FIG. 2, in which "x2", "x1", "x4" and "x30" indicate how many times the intensities were magnified.

The formed thin film was heated at 650° C. for 30 minutes in the oxygen atmosphere and its critical current density at 77K (liquid nitrogen temperature) was measured to find that it had the critical current density of $4 \times 10^6$ A/cm$^2$. This value was large in comparison with $1.8 \times 10^6$ A/cm$^2$ of the critical current density of the YBa$_2$Cu$_3$O$_{7-x}$ type superconducting film made by sputtering.

EXAMPLE 3

In the same manner as in Example 2, a thin film of a YBa$_2$Cu$_3$O$_{7-x}$ single crystal having the three-layered perovskite structure and a thickness of 3,000 Å was formed. After ten days from the formation of this thin film, a relationship between its resistivity and absolute temperature was measured. The results are shown in FIG. 3.

Figure 3:
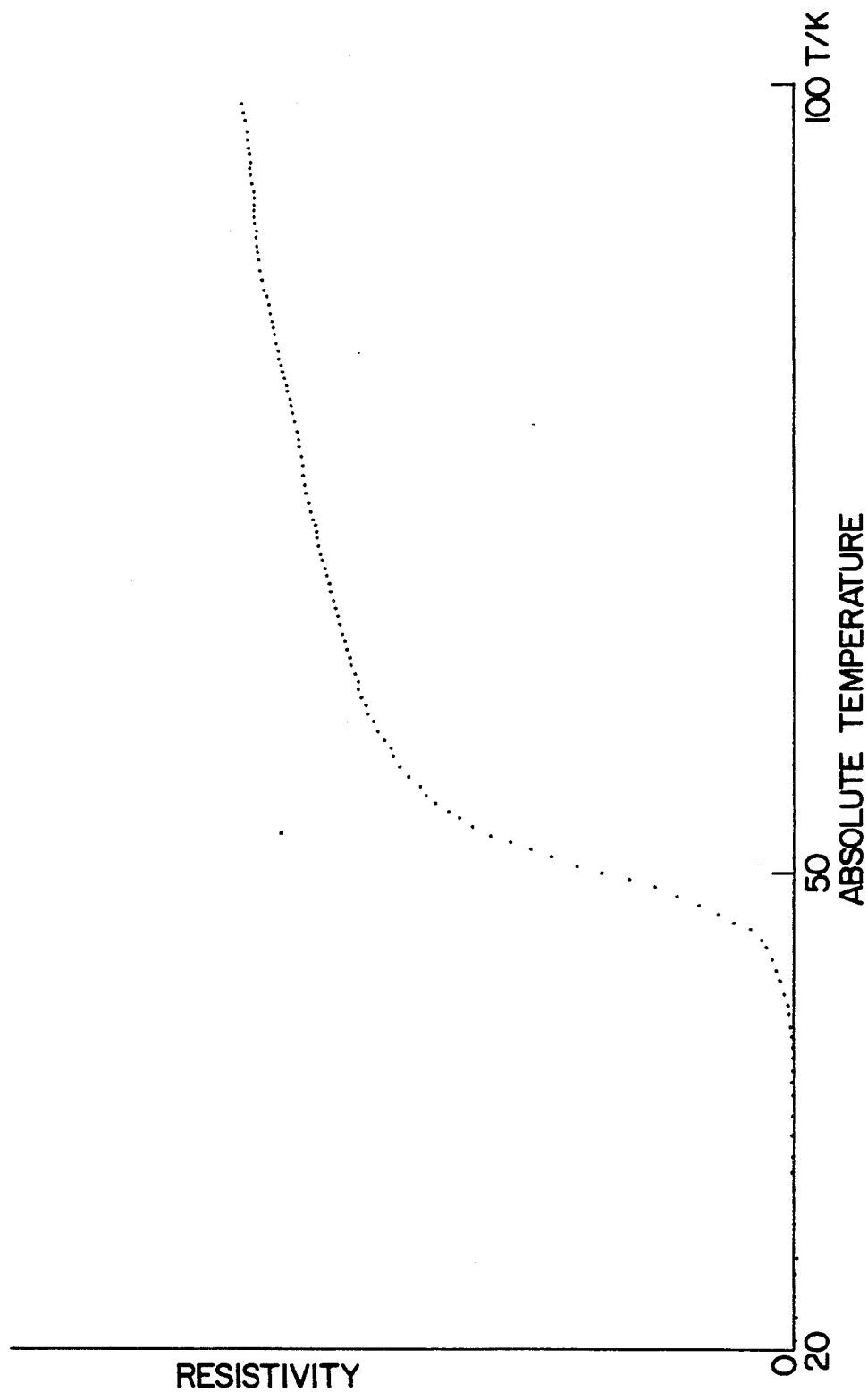
FIG. 3 is a graph showing the relationship between the resistivity and absolute temperature for the thin film of $YBa_2Cu_3O_{7-x}$ single crystal produced in Example 3.

As is apparent from FIG. 3, the formed thin film exhibited superconductivity at a temperature slightly lower than 50K. Such characteristics appear when an oxidation degree (X) is low. Further, it is apparent from FIG. 3 that the thin film had the orthorohmbic symmetry. After the thin film was heated at 500° C. for 30 minutes in the oxygen atmosphere, its electric resistance became 0 (zero) at 90K.

The above results indicate that the thin film of the single crystal of the present invention is different from the conventional ones and the produced thin film as such has superconductivity without post-heat-treatment at a high temperature of 900° C.

EXAMPLE 4

Surface morphological properties of the thin film of YBa$_2$Cu$_3$O$_{7-x}$ single crystal deposited in the same manner as in Example 2 were checked as follows:

As substrates, were used two pieces of SrTiO$_3$ single crystal one of which had been surface polished and the other of which had been surface polished and further chemically etched with a mixture of hydrofluoric acid and nitric acid. The non-etched substrate, a thin film of 300 Å in thickness formed on it and a thin film of 1,000 Å in thickness formed on it were examined by a scanning electron microscope (SEM). As the result, it was found that the polished surface of the SrTiO$_3$ single crystal was comparatively smooth, so that the thin film formed on it was continuous and had very smooth surface even when the thickness is only 300 Å. Further, it was found that the thin film was smooth when the film thickness reached 1,000 Å.

The etched substrate and the 1,000 Å thick film formed on it were examined by SEM, and it was found that the surface of the etched substrate had hillocks of several micrometers. Further, it was found that the SEM photograph of the thin film of 1,000 Å in thickness formed on the etched substrate was substantially the same as above and the thin film grew on the substrate with tracing the substrate surface exactly. This means that the deposition according to the present invention overgrew a uniformly thick film on the substrate surface and therefore made the smooth surface of the film on the same of substrate.

Figure 4:
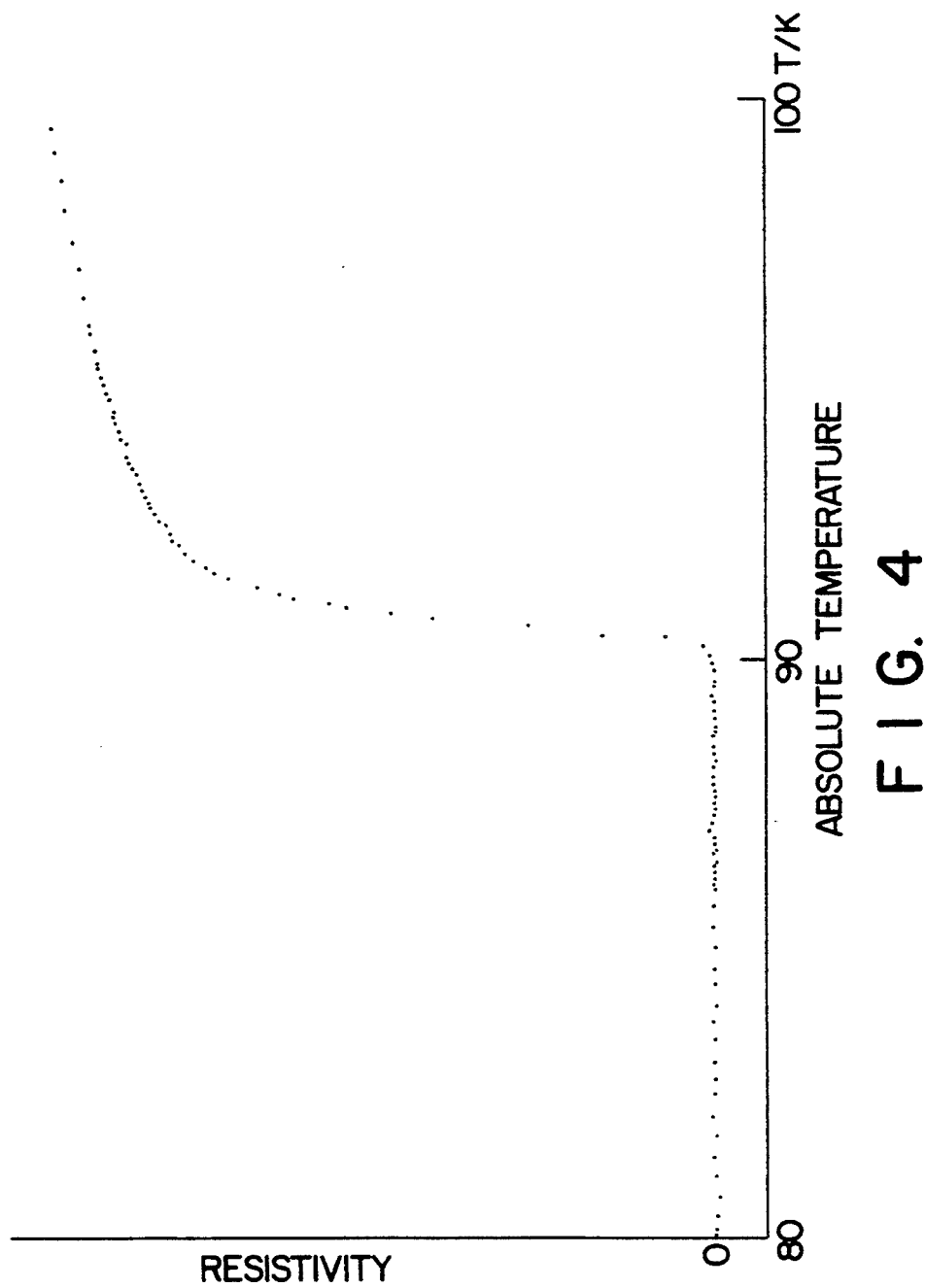
FIGS. 4 and 5 are graphs showing the relationship between the resistivity and absolute temperature and the relationship between the complex susceptibility $\chi$ and $\chi''$ ($\chi=\chi'-i\chi''$) which is measured under the AC-magnetic field applied perpendicular to the film surface and absolute temperature, respectively for the thin film of $YBa_2Cu_3O_{7-x}$ single crystal having a thickness of 2,000 Å formed on the non-etched (100) surface of $SrTiO_3$ single crystal in Example 4.

FIG. 4 shows change of resistivity against temperature of a thin film having a thickness of 2,000 Å which was formed on the polished substrate and heat treated in the oxygen atmosphere in the same manner as in below described Example 5. A transition temperature as defined by zero resistivity was 90.2K and a temperature range in which resistivity changed was as small as 1.7K, which suggested that a superconductive thin film with excellent quality was formed.

Figure 5:
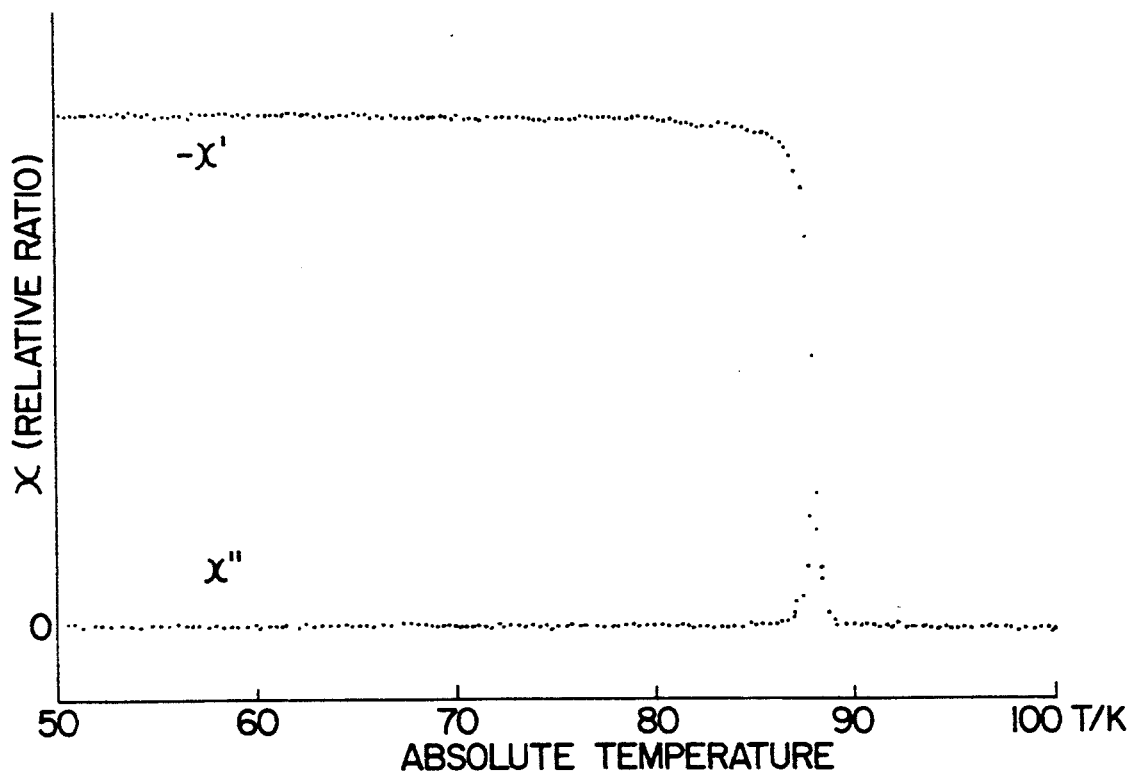

FIG. 5 shows change of complex susceptibility $\chi'$ and $\chi''$ against temperature of the same sample. Around the temperature at which the electrical resistance dropped to zero, a real part of the complex susceptibility $(-\chi')$ sharply increased and simultaneously its imaginary part $(\chi'')$ began to appear. These results indicates that the Meisner effect was observed when the electrical resistance became zero.

From the above facts, it can be concluded that the substrate on which the thin film of the LnA$_2$Cu$_3$O$_{7-x}$ single crystal is formed preferably has a smoothly polished surface and, on such substrate, the superconductive thin film having a smooth surface and excellent quality can be formed, so that it will be particularly useful in the production of electrical devices such as a SQUID device and a Josephson device.

EXAMPLE 5

Since the thin film just formed on the substrate does not necessarily exhibit good superconductivity, it is sometimes post-treated in an oxygen-containing atmosphere.

In this Example, effects of the post-treatment was confirmed on the YBa$_2$Cu$_3$O$_{7-x}$ single crystal formed in the same manner as in Example 2.

After deposition and cooling the evaporation sources (30 minutes), the oxygen gas was introduced in the vacuum vessel to pressurize the vessel to 1 atm. During this period, the the substrate temperature was decreased to 500° C. Then, the thin film of YBa$_2$Cu$_3$O$_{7-x}$ single crystal was kept at 500° C under oxygen pressure of 1 atm. for 1 hour to adjust the oxygen content in the thin film. A lattice constant $c_0$ of the non-oxidation-treated thin film in the [001] direction calculated from the X-ray diffraction pattern was 11.749 Å, while that of the oxidation-treated thin film was 11.686 Å. The lattice constant after post-treatment substantially corresponds to that of a bulk crystal having a critical temperature of 90K class. The super-conductive characteristics of the oxidation-treated thin film has been already shown in Example 4.

EXAMPLE 6

In the same manner as in Example 2 but using the SrTiO$_3$ with its (110) plane forming the surface and heating the substrate at 520° C., a thin film of YBa$_2$Cu$_3$O$_{7-x}$ single crystal having a thickness of 2,000 Å was formed.

In this Example, RHEED photographs of the substrate itself and the formed thin film of YBa$_2$Cu$_3$O$_{7-x}$ single crystal were taken. The photographs confirmed that the (110) plane of the YBa$_2$Cu$_3$O$_{7-x}$ single crystal having the three-layered perovskite structure was epitaxially grown on the (110) plane of the substrate.

The SEM photograph of the thin film of the single crystal was taken to confirm the surface smoothness.

EXAMPLE 7

Figure 6:
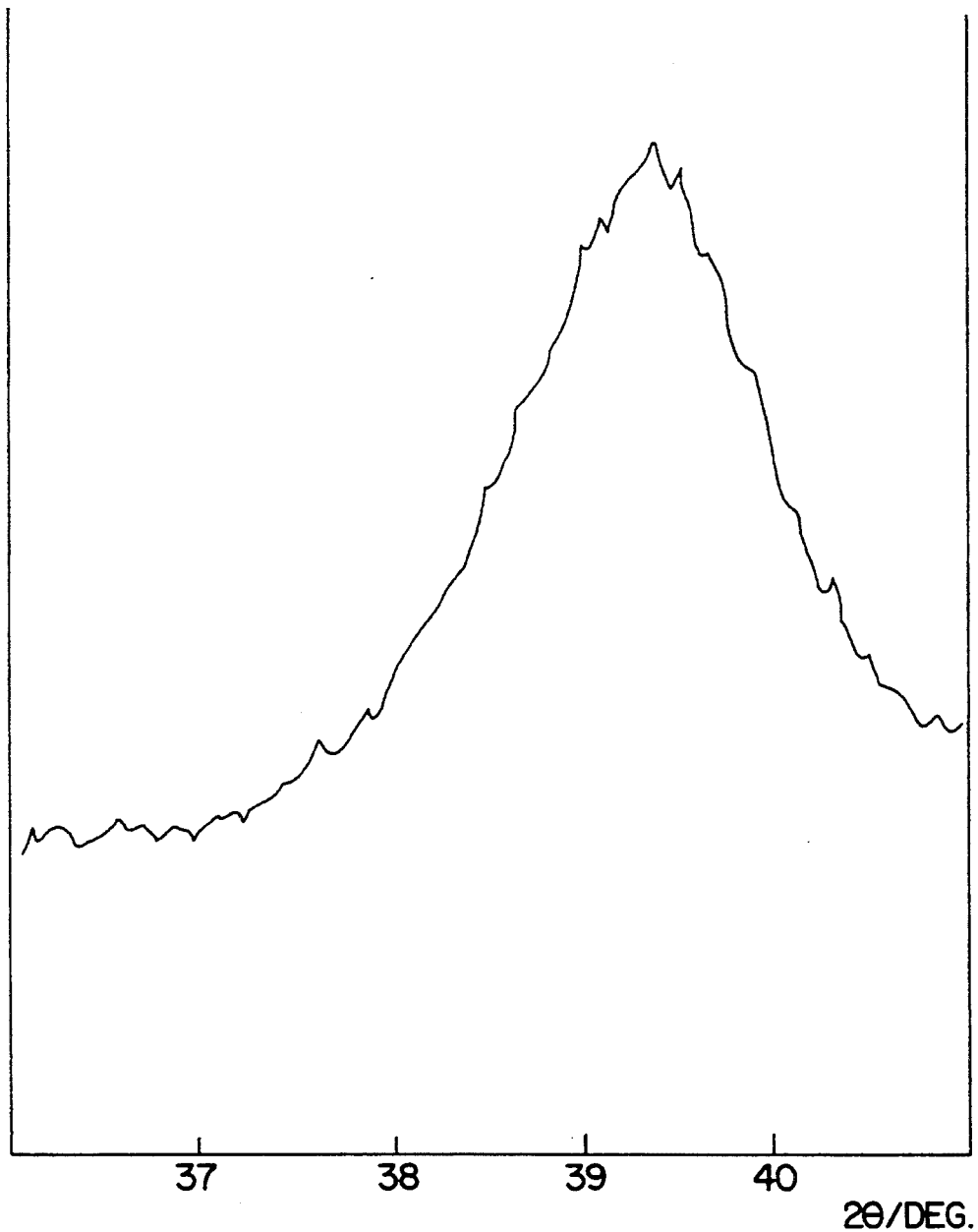

In the same manner as in Example 1 but evaporating metals Y and Sr by electron beam heating and metal Cu by resistance heating and depositing them on the (001) plane of the SrTiO$_3$ substrate kept at 640° C., a thin film having a thickness of 1,000 Å was formed. An X-ray diffraction pattern of the formed film is shown in FIG. 6, in which the diffraction peak corresponding to the (005) peak of the three layered perovskite structure like $YBa_2Cu_3O_{7-x}$.

EXAMPLE 8

Figure 7:
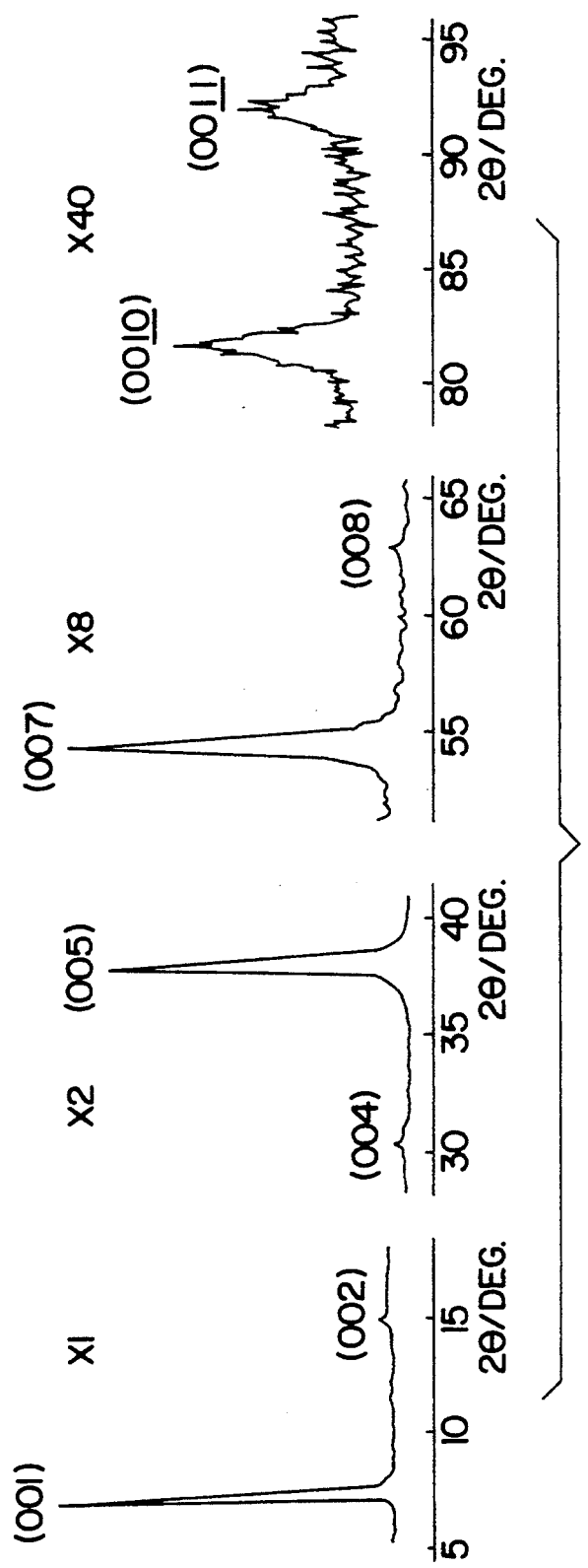
Figure 12A:
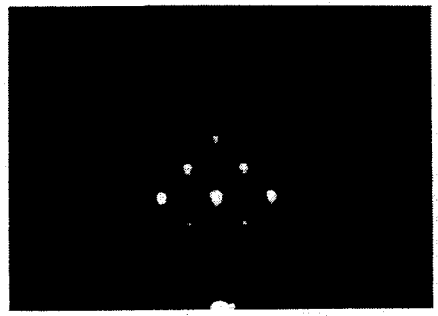
FIGS. 12A, 12B, 13A, 13B, 14A, 14B, 15A and 15B are the reflecting high energy electron diffraction (hereinafter referred to as "RHEED") photographs showing the crystal structure of the thin film of $YBa_2Cu_3O_{7-x}$ single crystal formed in Example 10.
Figure 12B:
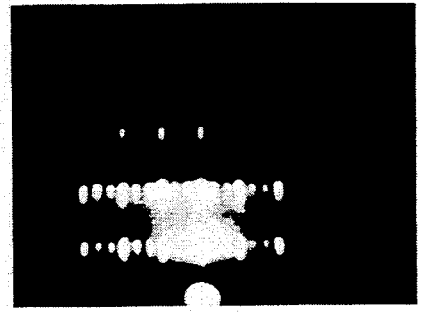
Figure 13A:
Figure 13B:
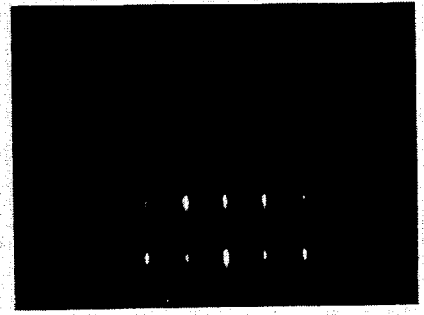
Figure 14A:
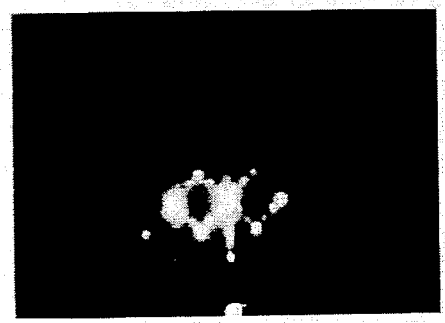
Figure 14B:
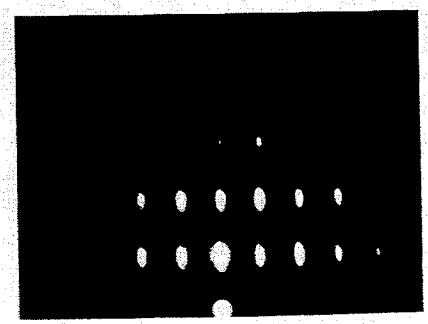
Figure 15A:
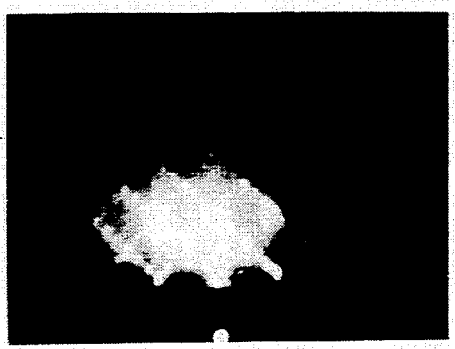
Figure 15B:
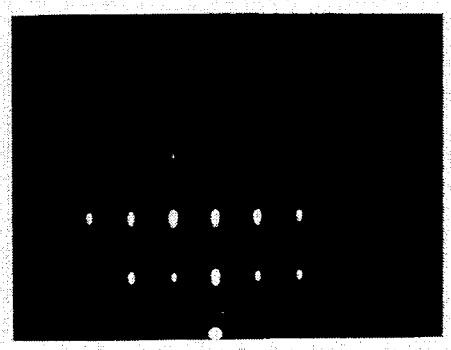

In the same manner as in Example 2 but using Dy or Er in place of Y, a thin film was formed. The X-ray diffraction patterns were shown in FIG. 7 (for Dy) and FIG. 8 (for Er). The formed thin film in which Ln was Dy or Er was characterized in that the intensity of the (001) peak was stronger than that in the case where Ln was Y. This is because the spacing corresponding to the (001) peak is a spacing of the rare metal elements, so that, in case of Dy or Er having the larger atomic number, both the scattering factors for the X-ray are larger than that of Y and therefore the diffraction peak of (001) becomes stronger.

EXAMPLE 9

In the same manner as in Example 2 except that an injection nozzle was inserted in a doughnut shaped oxygen diffusion chamber surrounding the periphery of the substrate, and oxygen injected from the nozzle was once diffused in the chamber and then supplied from slits provided on an inner peripheral wall over the substrate surface, a thin film having a thickness of 100 Å was formed.

The X-ray diffraction pattern of the formed thin film is shown in FIG. 9.

The thin film was then post-heat-treated in the oxygen atmosphere in the same manner as in Example 5. Change of the electrical resistance against temperature of the oxidation-treated thin film is shown in FIG. 10, and change of the complex susceptibility against temperature of the same thin film is shown in FIG. 11.

From these results, it is understood that the thin film of 100 Å in thickness was superconductive below 82K.

EXAMPLE 10

In the same manner as in Example 9 but using, as a substrate, the $SrTiO_3$ single crystal with a surface of its (110) plane and heating the substrate at 530° C., 550° C., 580° C. or 630° C., a thin film having a thickness of 500 Å was formed.

On each of the four thin films, an electron beam was irradiated along a direction of [001] or [1$\bar{1}$0] of the substrate to confirm the crystal orientation of each thin film by RHEED.

The results are shown in FIGS. 12A, 13A, 14A and 15A (along the [001] direction) and FIGS. 12B, 13B, 14B and 15B (along the [1$\bar{1}$0] direction. At 530° C., as seen from FIGS. 12A and 12B, the thin film of $YBa_2Cu_3O_{7-x}$ single crystal having the (110) plane which was parallel with the (110) plane of the substrate $SrTiO_3$ single crystal was formed. At 630° C., as seen from FIGS. 15A and 15B, the thin film of $YBa_2Cu_3O_{7-x}$ single crystal having the (103) plane which was parallel with the (110) plane of the substrate $SrTiO_3$ single crystal was formed.

At 550° C. and 580° C. which are between 530° C. and 630° C., as seen from FIGS. 13A, 13B, 14A and 14B, the thin films containing a mixture of (110) and (103) orientations of the $YBa_2Cu_3O_{7-x}$ were formed.

Figure 16:
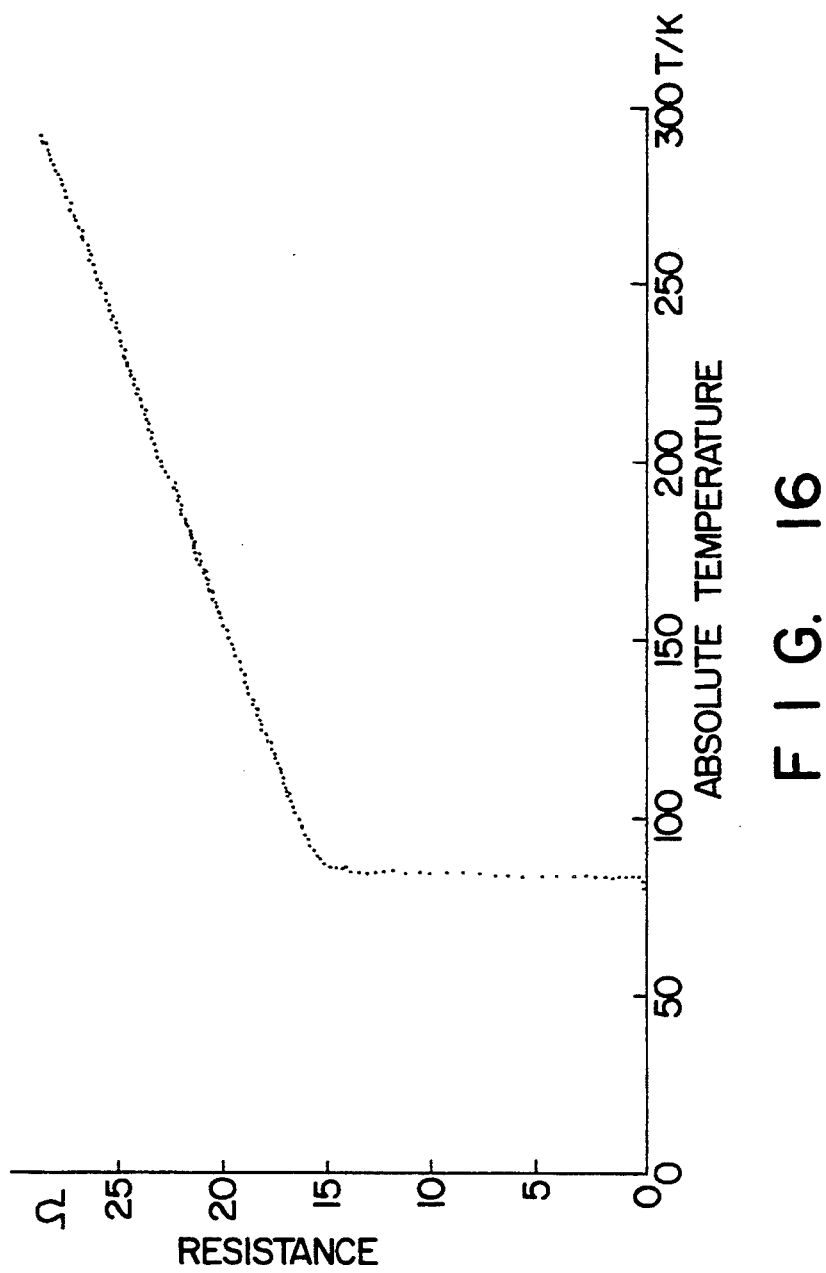
FIG. 16 is a graph showing the relationship between the resistivity and absolute temperature of the thin film formed in Example 10.

The thin film of $YBa_2Cu_3O_{7-x}$ single crystal which was formed at 630° C. and had a thickness of 500 Å was heat-treated in the oxygen atmosphere in the same manner as in Example 5 and change of the electrical resistance against temperature was measured. The results are shown in FIG. 16, which confirmed that the oxidation-treated thin film exhibited the superconductivity around 80K.

EXAMPLE 11

In the same manner as in Example 10 but using Er in place of Y and heating the substrate at 530° C., 580° C. or 630° C., a thin film was formed.

RHEED photographs of these three thin films were taken by irradiating the electron beam along two directions as in Example 10 to confirm the crystal structures.

Figure 17A:
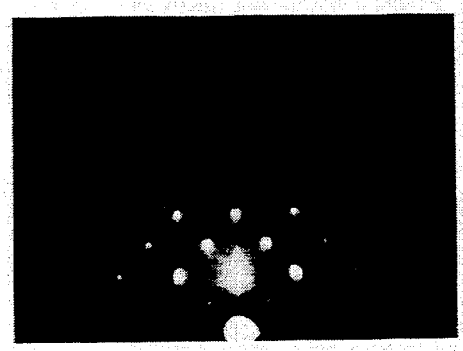
FIGS. 17A, 17B, 18A, 18B, 19A and 19B are the RHEED patterns revealing the crystal orientation of the thin film of $ErBa_2Cu_3O_{7-x}$ single crystal formed in Example 11.
Figure 17B:
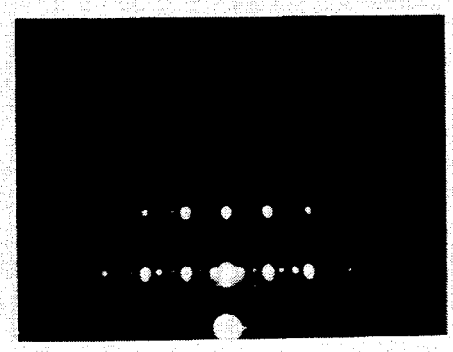
Figure 18A:
Figure 18B:
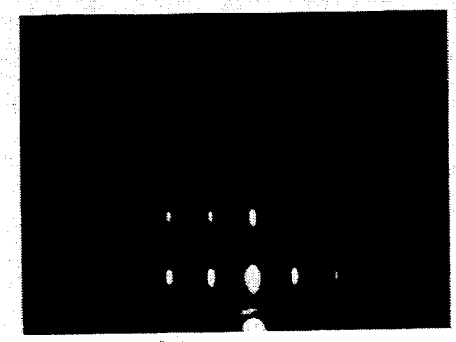
Figure 19A:
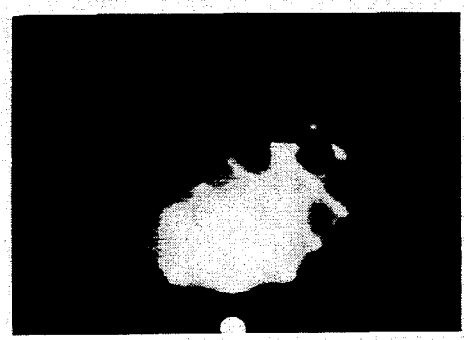
Figure 19B:
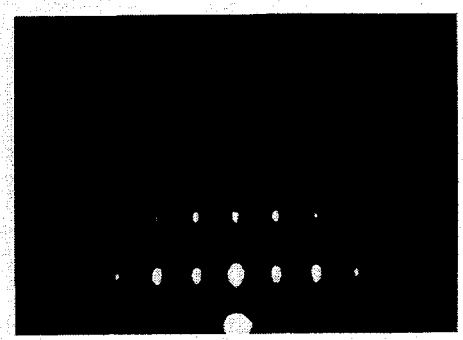

The results are shown in FIGS. 17A, 18A and 19A (along the [001] direction) and FIGS. 17B, 18B and 19B (along the [1$\bar{1}$0] direction. At 530° C., as seen from FIGS. 17A and 17B, the thin film of $ErBa_2Cu_3O_{7-x}$ single crystal having the (110) plane which was parallel with the (110) plane of the substrate $SrTiO_3$ single crystal was formed. At 630° C., as seen from FIGS. 19A and 19B, the thin film of $ErBa_2Cu_3O_{7-x}$ single crystal having the (103) plane which was parallel with the (110) plane of the substrate $SrTiO_3$ single crystal was formed.

At 580° C., as seen from FIGS. 18A and 18B, the thin film containing a mixture of (110) and (103) orientations of the $ErBa_2Cu_3O_{7-x}$ single crystals was formed.

EXAMPLE 12

In the same manner as in Example 9 but using, as a substrate, the $SrTiO_3$ single crystal with its (110) plane forming a surface and heating the substrate at 520° C., a thin film having a thickness of 150 Å was formed.

Then, in the same manner as in Example 9 but using the substrate on which the thin film having a thickness of 150 Å as the substrate and heating the substrate at 630° C., a second thin film having a thickness of 850 Å was formed.

RHEED photographs of the second thin film having the thickness of 850 Å was taken by irradiating the electron beam along two directions as in Example 10 to confirm the crystal structures.

Figure 20A:
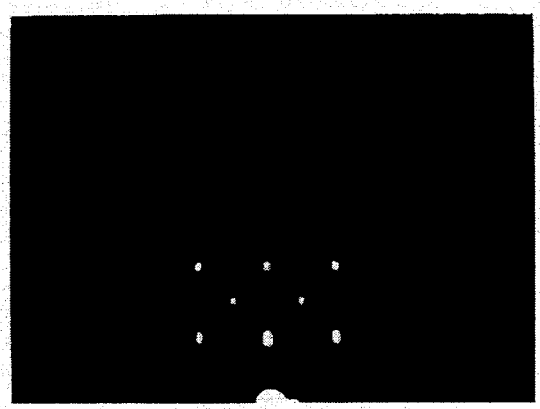
FIGS. 20A and 20B are the RHEED patterns revealing the crystal orientation of the thin film of $YBa_2Cu_3O_{7-x}$ single crystal formed in Example 12.
Figure 20B:
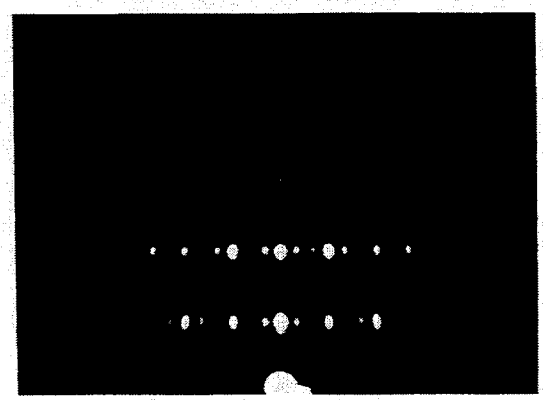

The results are shown in FIGS. 20A and 20B. As seen from these figures, the thin film of $YBa_2Cu_3O_{7-x}$ single crystal having the (110) plane which was parallel with the (110) plane of the substrate $SrTiO_3$ single crystal was formed.

The thin film of $YBa_2Cu_3O_{7-x}$ single crystal having the thickness of 850 Å was heat-treated in the oxygen atmosphere in the same manner as in Example 5 and change of the electrical resistance against temperature was measured. The results are shown in FIG. 21, which confirmed that the oxidation-treated thin film exhibited the superconductivity around 80K.

What is claimed is:

1. A process for producing a superconducting thin film consisting of a single crystal of $LnA_2Cu_3$ oxide:

$$[LnA_2Cu_3O_{7-x}] \quad (I)$$

wherein Ln is at least one rare earth element selected from the group consisting of Y, Nd, Sm, Eu, Gd, Dy, Ho, Er, Tm and Yb and A is at least one alkaline earth metal selected from the group consisting of Ba, Sr and Ca which has a three-layered perovskite structure, which comprises simultaneously evaporating Ln, A and Cu in an atomic ratio of about 1:2:3 from discrete evaporation sources of Ln, A and Cu onto a heated substrate in a vacuum vessel while blowing an oxygen gas onto the substrate to form an oxygen-containing atmosphere at the substrate, thereby forming said said superconducting thin film on the substrate.

2. The process according to claim 1, wherein a single crystal is used as the substrate with its (001) plane forming the substrate surface, and a (001) plane of the formed single crystal is parallel with the film surface.

3. The process according to claim 2, wherein the substrate is heated at a temperature of not lower than 500° C.

4. The process according to claim 1, wherein a single crystal is used as the substrate with its (110) plane forming the substrate surface, and a (110) plane of the formed single crystal is parallel with the film surface.

5. The process according to claim 4, wherein firstly the thin film of the single crystal of the oxide in which its (110) plane is parallel with the film surface is formed on the substrate heated at a temperature not lower than 500° C. and lower than 550° C., and then the oxide in which its (110) plane is parallel with the film surface is deposited on the firstly formed thin film heated at a temperature of not lower than 550° C.

6. The process according to claim 1, wherein a single crystal is used as the substrate with its (110) plane forming the substrate surface, and a (103) plane of the formed single crystal is parallel with the film surface.

7. The process according to claim 6, wherein the substrate is heated at a temperature of not lower than 550° C.

8. A process for producing a superconducting thin film of a single crystal of $LnA_2Cu_3$ oxide, which comprises simultaneously evaporating Ln, A and Cu in an atomic ratio of about 1:2:3 from discrete evaporation sources of Ln, A and Cu to deposit them on a substrate in a vacuum vessel while oxygen plasma is generated between the evaporation sources and the substrate and blowing onto the substrate an oxygen gas to form an oxygen-containing atmosphere at the substrate, thereby forming said superconducting thin film on the substrate.

9. The process according to claim 8, wherein a single crystal is used as the substrate with its (001) plane forming the substrate surface, and a (001) plane of the formed single crystal is parallel with the film surface.

10. The process according to claim 9, wherein the substrate is heated at a temperature of not lower than 500° C.

11. The process according to claim 8, wherein a single crystal is used as the substrate with its (110) plane forming the substrate surface, and a (110) plane of the formed single crystal is parallel with the film surface.

12. The process according to claim 11, wherein firstly the thin film of the single crystal of the oxide in which its (110) plane is parallel with the film surface is formed on the substrate heated at a temperature not lower than 500° C. and lower than 550° C., and then the oxide in which its (110) plane is parallel with the film surface is deposited on the firstly formed thin film heated at a temperature of not lower than 550° C.

13. The process according to claim 8, wherein a single crystal is used as the substrate with its (110) plane forming the substrate surface, and a (103) plane of the formed single crystal is parallel with the film surface.

14. The process according to claim 13, wherein the substrate is heated at a temperature of not lower than 550° C.

* * * * *